(12) United States Patent
Caliga

(10) Patent No.: US 12,032,010 B1
(45) Date of Patent: Jul. 9, 2024

(54) DEPLOYABLE RYDBERG RF SENSOR

(71) Applicant: ColdQuanta, Inc., Boulder, CO (US)

(72) Inventor: Seth Charles Caliga, Lafayette, CO (US)

(73) Assignee: ColdQuanta, Inc., Boulder, CO (US)

( * ) Notice: Subject to any disclaimer, the term of this patent is extended or adjusted under 35 U.S.C. 154(b) by 0 days.

(21) Appl. No.: 18/202,063

(22) Filed: May 25, 2023

Related U.S. Application Data

(63) Continuation-in-part of application No. 17/940,954, filed on Sep. 8, 2022, now Pat. No. 11,843,420.

(60) Provisional application No. 63/345,509, filed on May 25, 2022, provisional application No. 63/242,850, filed on Sep. 10, 2021.

(51) Int. Cl.
| | | |
|---|---|---|
| *H04B 10/00* | (2013.01) | |
| *G01R 29/08* | (2006.01) | |
| *G01R 29/12* | (2006.01) | |
| *H04J 14/00* | (2006.01) | |

(52) U.S. Cl.
CPC ......... *G01R 29/12* (2013.01); *G01R 29/0878* (2013.01)

(58) Field of Classification Search
CPC ............ H01Q 1/36; H04B 10/70; H04B 1/06; H04B 1/08; H04B 1/082
See application file for complete search history.

(56) References Cited

U.S. PATENT DOCUMENTS

| | | |
|---|---|---|
| 10,979,147 B2 | 4/2021 | Gordon |
| 11,165,505 B2 | 11/2021 | Gordon |
| 11,287,319 B2 | 3/2022 | Hugi |
| 11,349,569 B2 * | 5/2022 | Graceffo ............... H04B 10/40 |
| 2016/0363617 A1 | 12/2016 | Anderson |
| 2020/0292606 A1 | 9/2020 | Holloway |
| 2021/0250101 A1 * | 8/2021 | Gordon .................. H01Q 1/366 |
| 2021/0270882 A1 | 9/2021 | Imhof |
| 2022/0196716 A1 | 6/2022 | Anderson |
| 2022/0228972 A1 | 7/2022 | Nelson |
| 2023/0194590 A1 | 6/2023 | Burton |

OTHER PUBLICATIONS

Fan et al., Atom Based RF Electric Field Sensing, Journal of Physics B: Atomic, Molecular and Optical Physics, Topical Review, published Sep. 9, 2015, pp. 1-16.

Kumar et al., Atom-Based Sensing of Weak Radio Frequency Electric Fields Using Homodyne Readout, published Feb. 20, 2017, pp. 1-10.

Kumar et al., Rydberg-Atom based Radio-Frequency Electrometry using Frequency Modulation Spectroscopy in room Temperature Vapor Cells, Optics Express, vol. 25, No. 8, Apr. 17, 2017, pp. 8625-8637.

(Continued)

*Primary Examiner* — Daniel G Dobson

(74) *Attorney, Agent, or Firm* — Van Pelt, Yi & James LLP

(57) ABSTRACT

An electrometer is disclosed. The electrometer includes a housing, a vapor cell, a micro-optical system, an electric field generator, and a control electronic subsystem. The vapor cell has a top and a bottom and includes a vapor of quantum particles. The micro-optical system is configured to route laser fields through the vapor cell in a direction transverse to the top and the bottom. The electric field generator is configured to provide an electric field in the vapor cell. The housing includes a surface adapted to mate to a portion of a fuselage surrounding a hole.

20 Claims, 7 Drawing Sheets

(56) References Cited

OTHER PUBLICATIONS

Anderson et al., Rydberg atoms for radio-frequency communications and sensing: atomic receivers for pulsed RF field and phase detection, Rydberg Technologies Inc., Ann Arbor, MI 48103 USA; Oct. 18, 2019, 10 pages.

Berweger et al., Rydberg state engineering: A comparison of tuning schemes for continuous frequency sensing, Sep. 28, 2022; 11 pages.

Berweger et al., Rydberg-State Engineering: Investigations of Tuning Schemes for Continuous Frequency Sensing, Physical Review Applied 19, 044049, 13 pages, Apr. 18, 2023.

Bohaichuk et al., The Origins of Rydberg Atom Electrometer Transient Response and its Impact on Radio Frequency Pulse Sensing, Quantum Valley Ideas Laboratories, Sep. 13, 2022, 20 pages.

Cai et al., Sensitivity improvement of Rydberg atom-based microwave sensing via electromagnetically induced transparency, Nov. 15, 2021, 8 pages.

Carr et al., Three-photon electromagnetically induced transparency using Rydberg states, Optics Letters / vol. 37, No. 18, Sep. 15, 2012, 3 pages.

Carter et al., Electric field sensing near the surface microstructure of an atom chip using cold Rydberg atoms, Department of Physics and Astronomy and Institute for Quantum Computing, University of Waterloo, Dec. 21, 2013, 7 pages.

Daschner et al., Triple stack glass-to-glass anodic bonding for optogalvanic spectroscopy cells with electrical feedthroughs, Physikalisches Institut, Mar. 5, 2014, 4 pages.

David Henry Meyer, Magnetic & Electric Field Sensing And Applications Based On Coherent Effects In Neutral Atoms, 2018, 265 pages.

Fan et al., Sub-wavelength microwave electric field imaging using Rydberg atoms inside atomic vapor cells, Homer L. Dodge Department of Physics and Astronomy, The University of Oklahoma, Mar. 14, 2014, 5 pages.

Grabowski et al., High Resolution Rydberg Spectroscopy of ultracold Rubidium Atoms, Aug. 25, 2016, 9 pages.

Holloway et al., Broadband Rydberg Atom Based Self-Calibrating RF E-Field Probe, National Institute of Standards and Technology (NIST), Electromagnetics Division, 3 pages.

Holloway et al., Broadband Rydberg Atom-Based Electric-Field Probe: From Self-Calibrated Measurements to Sub-Wavelength Imaging, National Institute of Standards and Technology (NIST), U.S. Department of Commerce, Boulder Laboratories, May 27, 2014, 12 pages.

Holloway et al., Electric field metrology for SI traceability: Systematic measurement uncertainties in electromagnetically induced transparency in atomic vapor, Journal of Applied Physics 121, 233106; doi: 10.1063/1.4984201, 2017, 10 pages.

Holloway et al., Electromagnetically induced transparency based Rydberg-atom sensor for quantum voltage measurements, Oct. 26, 2021, 13 pages.

Hu et al., Continuously tunable radio frequency electrometry with Rydberg atoms, Appl. Phys. Lett. 121, 014002; https://doi.org/10.1063/5.0086357, Jul. 7, 2022, 7 pages.

Kilian Talo Theodor Singer, Interactions in an ultracold gas of Rydberg atoms, Oct. 2004, 133 pages.

Mao et al., A high-efficiency fiber-coupled Rydberg-atom integrated probe and its imaging applications, IEEE Antennas and Wireless Propagation Letters, 2022, 5 pages.

Meyer et al., Optimal Atomic Quantum Sensing using EIT Readout, Aug. 9, 2021, 12 pages.

Otto et al., Data capacity scaling of a distributed Rydberg atomic receiver array, Department of Physics, QSO-Centre for Quantum Science, and Dodd-Walls Centre, University of Otago, Dunedin, New Zealand, Apr. 8, 2021, 10 pages.

Prajapati et al., Enhancement of electromagnetically induced transparency based Rydberg-atom electrometry through population repumping, Aug. 31, 2021, 5 pages.

Prajapati et al., TV and Video Game Streaming with a Quantum Receiver: A Study on a Rydberg atom-based receiver's bandwidth and reception clarity, National Institute of Standards and Technology, May 13, 2022, 6 pages.

Renate Daschner, Addressable Rubidium vapor cells for optical and electrical read-out of Rydberg excitations, 2015, 195 pages.

Ripka et al., Rydberg atom-based radio frequency: hyperfine effects, Proc. SPIE 12016, Optical and Quantum Sensing and Precision Metrology II, 120160I, Mar. 2, 2022, 7 pages.

Simons et al., Continuous radio frequency electric-field detection through adjacent Rydberg resonance tuning, Oct. 9, 2021, 9 pages.

Simons et al., Using frequency detuning to improve the sensitivity of electric field measurements via electromagnetically induced transparency and Autler-Townes splitting in Rydberg atoms, Applied Physics Letters 108, 174101; doi: 10.1063/1.4947231, 2016, 6 pages.

Teale et al., Degenerate two-photon Rydberg atom voltage reference, AVS Quantum Sci. 4, 024403; https://doi.org/10.1116/5.0090892, Jun. 15, 2022, 6 pages.

Thaicharoen et al., Electromagnetically-induced transparency, absorption, and microwave field sensing in a Rb vapor cell with a three-color all-infrared laser system, May 27, 2019, 9 pages.

Van Ditzhuijzen et al., Simultaneous position and state measurement of Rydberg atoms, Eur. Phys. J. D 40, 13-17. DOI: 10.1140/epjd/e2006-00140-1, Jun. 21, 2006, 6 pages.

You et al., Microwave-field sensing via electromagnetically induced absorption of Rb irradiated by three-color infrared lasers, vol. 30, No. 10, Optics Express, May 9, 2022, 11 pages.

\* cited by examiner

# DEPLOYABLE RYDBERG RF SENSOR

CROSS REFERENCE TO OTHER APPLICATIONS

This application claims priority to U.S. Provisional Patent Application No. 63/345,509 entitled RYDBERG RF SENSOR WITH RUBIDIUM VAPOR CELL filed May 25, 2022, which is incorporated herein by reference for all purposes.

This application is a continuation in part of U.S. patent application Ser. No. 17/940,954 entitled RADIO-FREQUENCY RECEIVER PUMPED TO HIGH-AZIMUTHAL RYDBERG STATES filed Sep. 8, 2022, which claims priority to U.S. Provisional Patent Application No. 63/242,850 filed Sep. 10, 2021, both of which are incorporated herein by reference for all purposes.

GOVERNMENT FUNDING

This invention was made with government support under grant number HR0011-21-C-0152 awarded by the Defense Advanced Research Projects Agency (DARPA). The United States Government has certain rights in the invention.

BACKGROUND OF THE INVENTION

Conventional radio frequency (RF) detectors utilize antennas in order to detect RF radiation (i.e. RF signals). These antennas scale with the wavelengths to be detected. Thus, longer antennas are used to detect RF signals having longer wavelengths. This adversely affects the size, weight, and power (SWAP) requirements of RF detectors, particularly RF detectors configured to detect long wavelengths (e.g. RF detectors for longer wavelengths or wideband RF detectors in which the band includes longer wavelengths requiring longer antennas). As a result, certain conventional RF detectors may not be deployed for on-board navigation and other applications. Moreover, the sensitivity of such conventional RF detectors can be insufficient for some purposes.

Quantum RF detectors may provide greater sensitivity and may not scale with the wavelength RF radiation detected. However, further improvements in the sensitivity may be desired. In addition, quantum RF detectors are generally limited to the laboratory environment. Consequently, a deployable RF detector having the requisite sensitivity is desired.

BRIEF DESCRIPTION OF THE DRAWINGS

Various embodiments of the invention are disclosed in the following detailed description and the accompanying drawings.

DETAILED DESCRIPTION

Figure 1A:
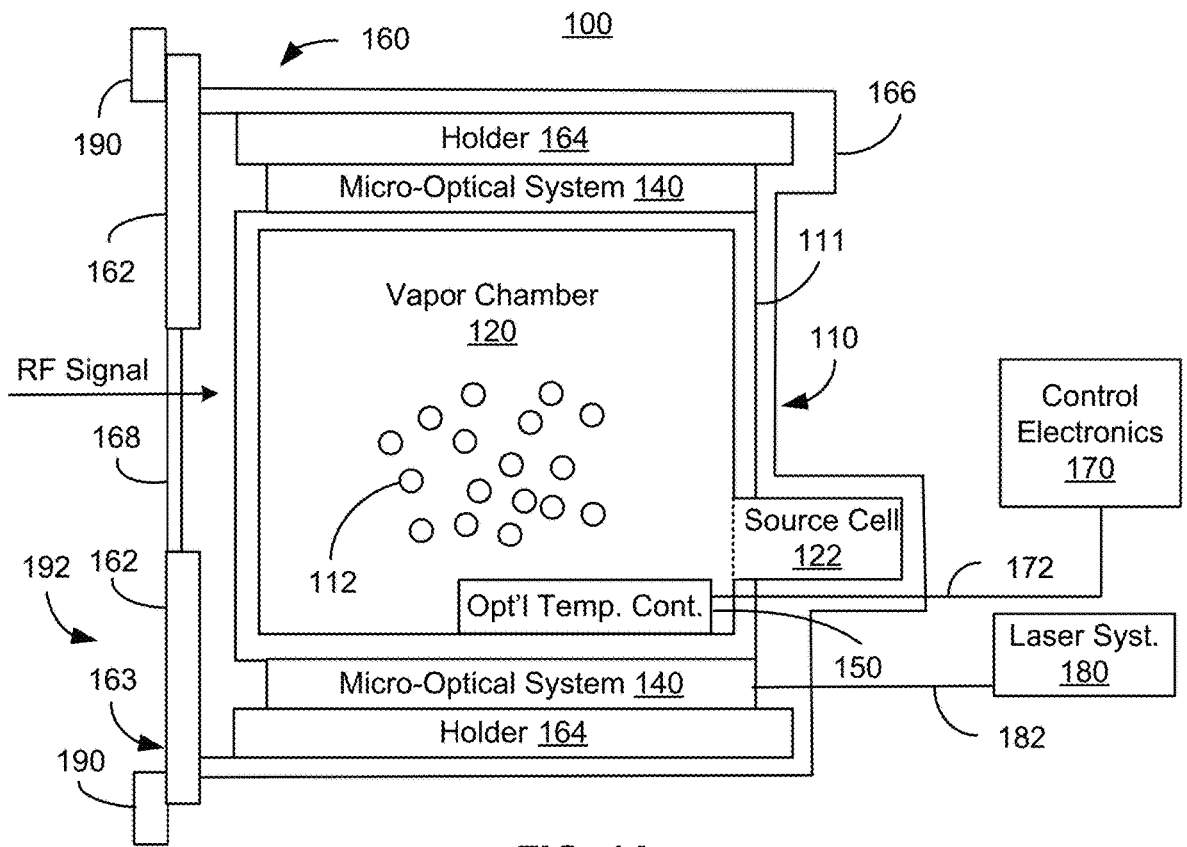
FIGS. 1A-1B depict an embodiment of an electrometer that is deployable.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

An electrometer is disclosed. The electrometer includes a housing, a vapor cell, a micro-optical system, an electric field generator, a laser system, and a control electronic subsystem. The vapor cell has a top and a bottom and includes a vapor of quantum particles. The micro-optical system is configured to route laser fields through the vapor cell in a direction transverse to the top and the bottom. The electric field generator is configured to provide an electric field in the vapor cell. The housing includes a surface adapted to mate to a portion of a fuselage surrounding a hole.

In some embodiments, the laser fields excite the quantum particles to a first Rydberg state. The quantum particles transition to a second Rydberg state in response to an incident radio frequency (RF) signal having a RF frequency of $v_{RF}$. In some embodiments, the laser fields include a probe beam transmitted through the vapor cell. In such embodiments, the electric field generator provides the electric field within the vapor cell such that a distribution between the first Rydberg state and the second Rydberg state and an intensity of the probe beam vary at a local oscillator frequency $v_{LO}$. Further, the incident RF signal having the RF frequency of $v_{RF}$ interferes to yield a beat frequency $\Delta_{RF}$ that is imposed on the population distribution between the first Rydberg state and the second Rydberg state and on the intensity of the probe beam. In such embodiments, the electrometer further includes a photodetector for producing a photodetector signal that tracks the intensity of the probe beam and a signal processor for decoding the photodetector signal. The micro-optical system may further provide a coupling laser beam and at least one dressing laser beam. The probe beam, the dressing beam(s) and the coupling laser beam cooperate to pump the quantum particles to the first Rydberg state. In some embodiments, the incident RF signal having the RF frequency of $v_{RF}$ has a range of at least one MHz through not more than 1.5 GHz. In some embodiments, the range may be at least one hundred kHz through 40 GHz. The electrometer may have a sensitivity that includes a range of at least ten nanovolts per centimeter per sqrt (Hz) through not more than one hundred nanovolts per centimeter per sqrt (Hz). The housing may also include a flange having the surface and a dielectric holder for the vapor cell. The dielectric holder is configured to mitigate interference with the incident RF signal.

In some embodiments, the vapor cell is fluidically coupled to a source cell including a plurality of alkali atoms for the quantum particles. The vapor cell may have a volume of less than one hundred cubic centimeters. In some embodiments, the volume is less than fifty cubic centimeters. The source cell may have a volume that is significantly less than the vapor cell. For example, for a one cubic centimeter vapor cell, the source cell may be on the order of 0.2 cubic centimeter in volume.

In some embodiments, the electric field generator includes a semiconductor device coupled to the top of the vapor cell. The control electronic subsystem in such embodiments includes a voltage source coupled with the semiconductor device by a tether. In some embodiments, the top of the vapor cell includes a glass wall to which the semiconductor device is anodically bonded. The voltage source provides a DC voltage and/or a time varying voltage to the semiconductor device.

In some embodiments, the micro-optical system includes a first portion and a second portion. The first portion is coupled with a first wall of the vapor cell and optically coupled with at least one laser. The second portion includes a retroreflector and is coupled with a second wall of the vapor cell. The first wall is opposite to the second wall such that a laser beam from the micro-optical system traverses the vapor cell, is reflected by the retroreflector, and returns to the micro-optical system.

A radio frequency (RF) radiation detector is described. The RF radiation detector includes a housing and an electrometer. The housing includes a surface and a container. The surface is adapted to mate to a portion of a fuselage surrounding a hole. The electrometer is coupled with the housing. The electrometer includes a vapor cell having a top and a bottom, a micro-optical system, an electric field generator, and a control electronic subsystem. The vapor cell includes a vapor of quantum particles and is in the container of the housing. The micro-optical system is in the container and is configured to route laser fields through the vapor cell in a direction transverse to the top and the bottom. At least a portion of the electric field generator is in the container. The laser fields excite the quantum particles to a first Rydberg state. The quantum particles transition to a second Rydberg state in response to an incident RF signal having a RF frequency of $v_{RF}$. The RF frequency of $v_{RF}$ may have a range of at least one MHz through not more than 1.5 GHz. In some embodiments, the range may be at least one hundred kHz through 40 GHz. The sensitivity of the RF detector includes a range of at least ten nanovolts per centimeter per sqrt (Hz) through not more than one hundred nanovolts per centimeter per sqrt (Hz). In some embodiments, the top of the vapor cell includes a glass wall and the electric field generator includes a semiconductor device anodically bonded to the glass wall of the vapor cell. In such embodiments, the control electronic subsystem includes a voltage source coupled with the semiconductor device by a tether.

A method is described. The method includes exciting, by laser fields, quantum particles in a vapor cell of an electrometer to a first Rydberg state. The electrometer is coupled to a housing and includes the vapor cell, a micro-optical system, an electric field generator, and a control electronic subsystem. The housing includes a surface and a container. The surface is adapted to mate to a portion of a fuselage surrounding a hole. The vapor cell includes a vapor of the quantum particles and is in the container of the housing. The vapor cell has a top and a bottom. The micro-optical system is in the container and configured to route the laser fields through the vapor cell in a direction transverse to the top and the bottom. At least part of the electric field generator is in the container. The method also includes receiving an incident RF signal in the vapor cell. The quantum particles transition to a second Rydberg state in response to the incident RF signal having an RF frequency of $v_{RF}$.

In some embodiments, the laser fields include a probe beam. The method further includes generating, by the electric field generator, an oscillating electric field having a local oscillator frequency $v_{LO}=v_{RF}\pm\Delta_{RF}$. The frequency $\Delta_{RF}$ is a beat frequency resulting from mixing a target radio frequency with the local oscillator frequency. A distribution of the quantum particles between the first Rydberg state and the second Rydberg state and an intensity of the probe beam oscillate at the local oscillator frequency $v_{LO}$.

Figure 1B:
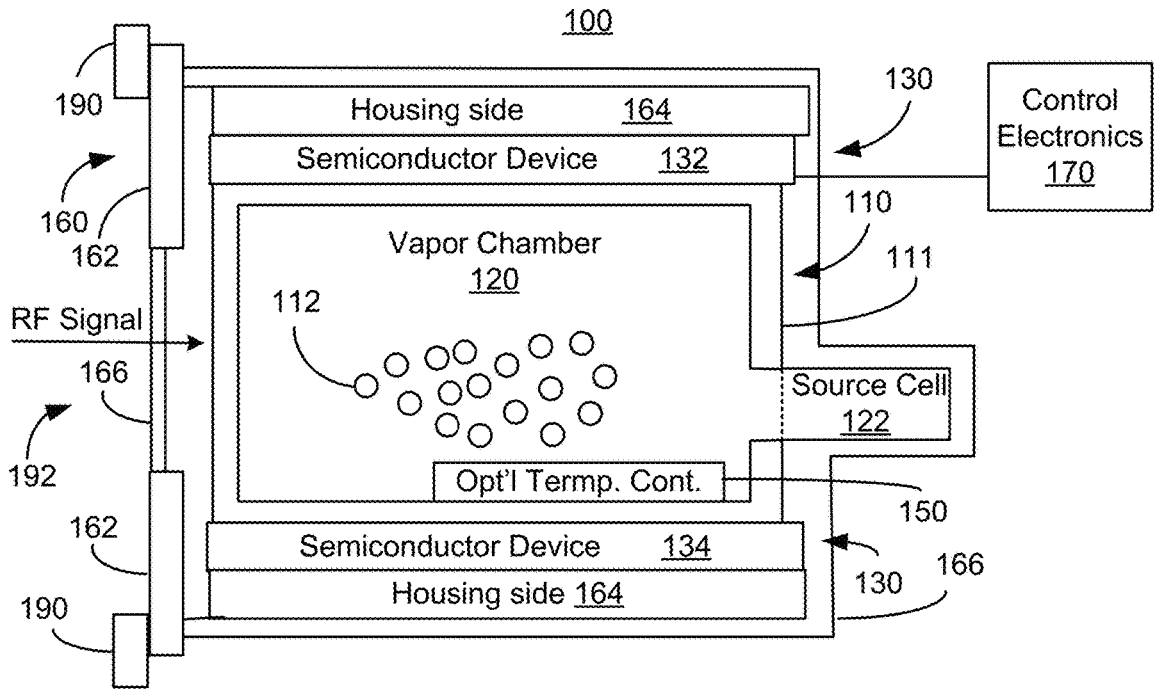

FIGS. 1A-1B depict an embodiment of electrometer 100 that is deployable. Electrometer 100 may be used as an RF detector. For clarity, FIGS. 1A-1B are not to scale and only portions of electrometer 100 are shown. FIGS. 1A and 1B depict top and side views, respectively, of electrometer 100. In other embodiments, however, the components of electrometer may be arranged differently than shown in FIGS. 1A-1B. The environment in which electrometer 100 is used is also depicted. Thus, a portion of a fuselage 190 having hole 192 therein is shown. Fuselage 190 may be for an aircraft. However, in some embodiments, fuselage 190 may correspond to another vehicle or location at which electrometer 100 is deployed. For example, a fuselage may correspond to a portion of a spacecraft, a ground vehicle, a submarine, or a ship.

Electrometer 100 includes vapor cell 110, electric field generator 130, micro-optical system 140, housing 160, and control electronic subsystem 170. In some embodiments, electrometer includes optional temperature controller 150 and laser system 180. Vapor cell 110 has a top and a bottom and includes a vapor of quantum particles 112 therein. Electric field generator 130 is configured to provide an electric field in vapor cell 110. In the embodiment shown, electric field generator 130 includes semiconductor devices (e.g. silicon chips 132 and 134) at the top and bottom of vapor cell 110. Micro-optical system 140 is configured to route laser fields through vapor cell 110 in a direction transverse to the top and the bottom (e.g. transverse to the electric field generated by electric field generator 130). Housing 160 includes a surface adapted to mate to a portion of fuselage 190 surrounding hole 192.

Electrometer 100 is sufficiently small that hole 192 may be used as a source of an input signal desired to be detected. For example, in some embodiments, vapor cell 110 may have a volume not exceeding one hundred cubic centimeters. In some embodiments, the volume of vapor cell 119 does not exceed seventy-five cubic centimeters. In some embodiments, the volume of vapor cell 110 does not exceed fifty cubic centimeters. The volume of vapor cell 110 does not exceed twenty-five cubic centimeters. In some embodiments, the volume of vapor cell 110 does not exceed ten cubic centimeters. For example, the volume of vapor cell 110 may be one cubic centimeter or less. In such an embodiment, the height of vapor cell 110 (between semiconductor devices 132 and 134) may be approximately six millimeters and the width (between portions of micro-optical system 140) may be ten millimeters.

Vapor cell 110 includes walls 111 forming a vapor chamber 120 therein. Vapor cell 110 may also include source cell 122 and optional temperature controller 150. Vapor cell 110 is hermetically sealed and under vacuum. Some or all of walls 111 of vapor cell 110 are configured to reduce or eliminate interference with the radiation (e.g. RF radiation) desired to be detected. Walls 111 are also transparent to the laser fields provided via micro-optical system 140. Walls 111 of vapor cell 110 may thus be glass.

Vapor chamber 120 includes a vapor of quantum particles 112 (of which only one is labeled), but minimal (or no) other species. Quantum particles 112 are provided by a source, such as an alkali metal (e.g. Cs and/or Rb). In some embodiments, source cell 122 includes the source of quantum particles 112. For example, source cell 122 may include a film of alkali metal on the inner walls of source cell 122 or a solid pill of the alkali metal. Other species (e.g. other alkali metals) and other phases of sources might be used in some embodiments. Source cell 122 is fluidically coupled with vapor chamber 120. The vapor pressure of the alkali metal provides the quantum particles 112 in source cell 122, which travel into vapor chamber 120 via the fluidic connection. The alkali metal or other solid source in source cell 122 is such that the desired quantity and/or density of quantum particles is present in vapor chamber 120 during use of electrometer 120. Further, the solid source in source cell 122 provides quantum particles 112 having the desired properties. For example, quantum particles 112 have the desired energy states for functioning of electrometer 100.

The operating temperature of electrometer 100 may be at least twenty degrees Celsius and not more than seventy-five degrees Celsius. In some embodiments, other operating temperature(s) may be used. Temperature controller 150 may control the temperature of vapor cell 110 to achieve the desired operating temperature(s). For example, temperature controller 150 may control the temperature of vapor chamber 120 and/or source cell 122 such that the desired vapor pressure of quantum particles 112 is maintained during use. In some embodiments, temperature controller 150 may be a resistive heater. However, the amount of metal in electrometer 100 may be desired to be reduced to mitigate perturbations to fields within vapor cell 110. In some embodiments, temperature controller 150 may include a nonreflective surface that absorbs infrared radiation and dissipates heat. Other mechanisms for controlling the temperature of vapor cell 110 may also be used.

Various coatings may be present on the interior and/or exterior surfaces of walls 111 of vapor cell 110. For example, antireflective (AR) coating(s), highly reflective (HR) coating(s), conductive coating(s), dielectric coating(s) (e.g. aluminum oxide or sapphire), barrier coating(s), passivation layer(s), electrical traces and/or other coatings/structures may be applied to the interior and/or exterior surfaces of glass walls 111. Such coatings may enhance the performance of electrometer 100. For example, AR coating(s) may reduce the reflection of laser light traversing vapor cell 110. Passivation layer(s) such as aluminum oxide may reduce surface interactions and mitigate issues with field homogeneity that would otherwise affect quantum particles 112. For example, such interactions might broaden the line widths of transitions and adversely affect sensitivity. A conductor, such as indium-tin-oxide (ITO) that is transparent as a thin film, may also be used. Thus, in addition to vapor cell 110 allowing electric fields (e.g. RF signals) and laser fields (e.g. laser beams) to traverse vapor cell 110, such coatings may improve the performance of electrometer 100. Vapor cell 110 may also be made longer in the direction laser fields traverse vapor chamber 120. This allows for more interrogation of quantum particles 112 and less interaction of quantum particles 112 with walls 111 of vapor cell 110.

Electric field generator 130 provides and electric field in vapor chamber 120. For example, semiconductor devices 132 and 134 include a silicon substrate and metallization. The metallization provides an electrical connection to tether 172 and/or ground. Tether 172 (or other mechanism) electrically connects electric field generator 130 to control electronic subsystem 170. Thus, control electronic subsystem 170 may be physically remote from electric field generator 130. For example, vapor cell 110 may be mounted on the fuselage at the nose of an aircraft, while control electronic subsystem 170 may be located in a bay at the rear of the aircraft. Control electronic subsystem 170 controls electric field generator 130 to provide an electric field within vapor chamber 120. For example, control electronic subsystem 170 may include voltage source(s) connected to semiconductor devices 132 and 134, which act as capacitor plates. The voltage is applied across semiconductor devices 132 and 134. This voltage may be a constant, DC voltage and/or a time varying (AC) voltage. The DC voltage may be used to tune the electronic states of quantum particles 112 via the Stark shift. The AC voltage may be used to provide an oscillating electric field in vapor cell 110. In some embodiments, semiconductor devices 132 and 134 are mounted to vapor cell 110. For example, semiconductor devices 132 and 134 may be anodically bonded to vapor cell 110.

Micro-optical system 140 routes laser fields through vapor chamber 120. For example, laser system 180 may generate one or more laser beams that are transmitted to micro-optical system 140 by tether 182. Tether 182 (or other mechanism) optically connects micro-optical system 140 to laser system 180. Thus, laser system 180 may be physically remote from micro-optical system 140. For example, vapor cell 110 may be mounted on the fuselage at the nose of an aircraft, while laser system 180 may be located in a bay at the rear of the aircraft. Laser system 180 and control electronic subsystem 170 may be in the same location (e.g. the same bay and/or rack) or in different locations. Fiber optic and/or other optical cables in tether 182 transmit the laser light to micro-optical system 140. Micro-optical system 140 may include prisms, lenses, waveguides, and/or other components for directing laser light into vapor cell 110. Micro-optical system 140 also includes retroreflector(s) on the opposite wall of vapor cell 110. Thus, laser light is emitted by micro-optical system 140 at a first wall, traverses vapor chamber 120, is reflected by the retroreflector 140, and returns to the first wall. The laser light may undergo additional reflections by micro-optical system at the first wall and/or additional retroreflections. Thus, the laser light may undergo multiple passes through the vapor chamber 120.

Housing 160 includes a flange 162, holder 164, container 166, and cover 168. Flange 162 has surface 163 configured to mate with fuselage 190. Flange 162 is thus larger than hole 192. Further, flange includes cover 166. Cover 166 protects electrometer 100 from damage while allowing the RF signal or other input signal to be received. Vapor cell 110 and micro-optical system 140 are mounted in holder 164. Thus, holder 164 preserves the alignment between micro-optical system 140 and vapor cell 110. Micro-optical system 140 may be mounted to vapor cell 110. In some embodiments, semiconductor devices 132 and 134 are mounted to vapor cell 110. Thus, holder 164 may maintain the alignment between semiconductor devices 132 and 134, vapor cell 110, and micro-optical system 140. Container 166 may enclose or partially enclose holder 164, micro-optical system 140, electric field generator 130, and vapor cell 110. Further, container 166 maintains the position of holder 164, and thus the relative positions of micro-optical system 140, electric field generator 130, and vapor cell 110. Holder 164 and container 166 are formed of materials that mitigate interference with and/or attenuation of the RF signal. For example, holder 164 and container 166 may be formed of dielectric(s). In some embodiments, holder 164 and/or container 166 include or are made of MACOR®. In some embodiments, holder 164 and container 166 may be integrated into a single piece. Container 166 may include RF absorbing foam or other component(s) to mitigate the impact on the RF signal. Container 166 and/or holder 164 may also provide some vibration isolation.

Figure 2:
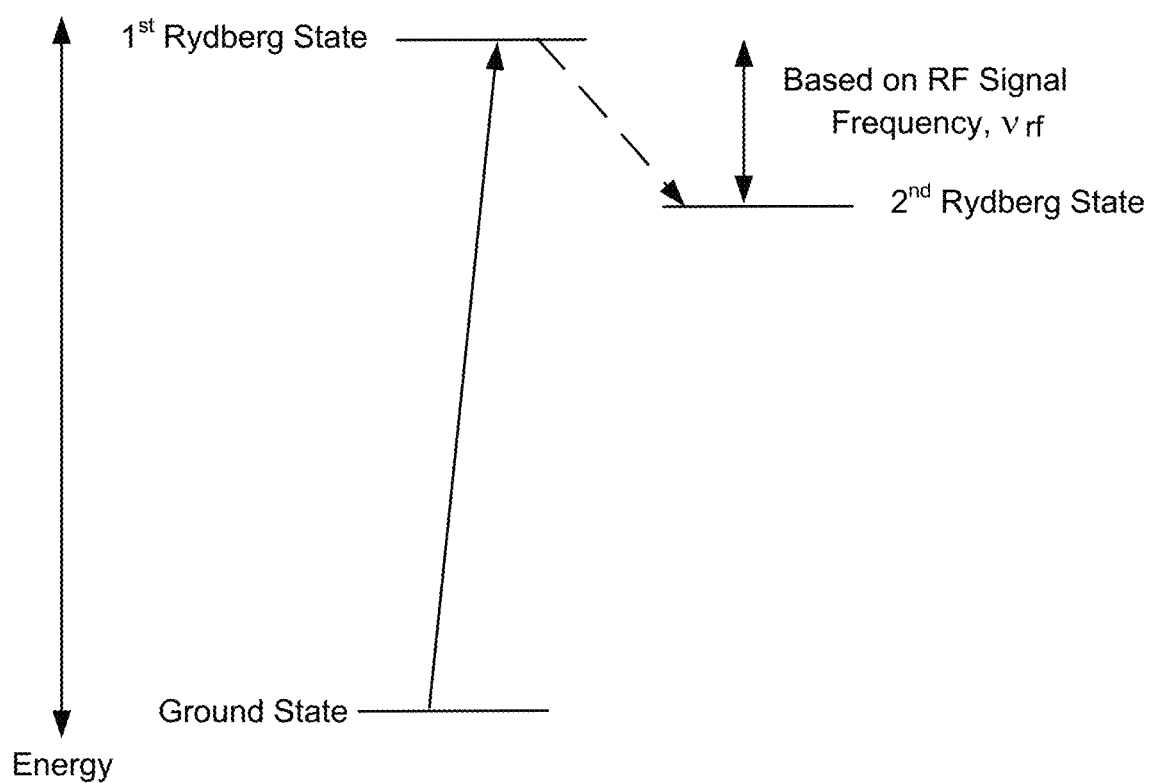
FIG. 2 depicts transitions for quantum particles usable in an electrometer that is deployable.

In operation, micro-optical system 140 provides laser fields that excite quantum particles 121 to a first Rydberg state. This may be seen in FIG. 2, which graphically depicts an embodiment of some electronic states for quantum particles 112. Although only the ground state, the first Rydberg state and the second Rydberg state are shown, other energy states are possible. The locations (energies) of the first and/or second Rydberg states may be fine-tuned by using electric field generator 130 to provide a DC electric field that shifts the energy state. Thus, the location and separation of the energy levels of quantum state carriers 112 may be tuned. In response to the RF signal having a particular frequency, $v_{rf}$, for which electrometer 100 is tuned, quantum particles undergo a transition from the first Rydberg state to the second Rydberg state. Based on the populations of quantum state particles in the first and second Rydberg states, the RF signal may be detected.

In some embodiments, electrometer 100 uses a heterodyne detection system. In such embodiments, the laser fields provided by micro-optical system 140 include a probe beam transmitted through vapor cell 110. In such embodiments, electric field generator 130 provides an oscillating electric field within vapor cell 110. Thus, the distribution of quantum state particles 112 in the first Rydberg state and the second Rydberg state and the intensity of the probe beam vary at a local oscillator frequency $v_{LO}$. In such an embodiment, the incident RF signal for which electrometer 100 is tuned interferes to yield a beat frequency $\Delta_{RF}$ that is imposed on the distribution between the first Rydberg state and the second Rydberg state and on the intensity of the probe beam. In such embodiments, electrometer 100 further includes a photodetector for producing a photodetector signal that tracks the intensity of the probe beam and a signal processor for decoding the photodetector signal. Micro-optical system 140 may further provide a coupling laser beam and at least one dressing laser beam to vapor chamber 120. The probe beam, the dressing beam(s) and the coupling laser beam cooperate to pump the quantum particles to the first Rydberg state.

Electrometer 100 thus utilizes quantum particles for detection of RF signals. As a result, electrometer 100 need not scale in size with the wavelength of RF signals desired to be detected. Vapor chamber 110, micro-optical system 140, and electric field generator 130 have been miniaturized to provide detection of electrical signals (e.g. RF fields) using a very small vapor chamber 120 having the volumes (e.g. not more than one hundred cubic centimeters, not more than seventy-five cubic centimeters, not more than fifty cubic centimeters, not more than ten cubic centimeters) described herein. The alignment of these components may be achieved and maintained using holder 164 and container 166. The components may also be deployed on fuselage 190 using flange 162. Control electronic subsystem 170, laser system 180, and other electronics, may be tethered to electrometer 100 while maintaining their functionality. Thus, electrometer 100 may be simpler to deploy and more robust. Housing 160 is configured to mitigate interference with the input RF signal. Consequently, electrometer 100 is a small, light (i.e. meeting SWaP requirements), readily mountable package capable of detecting longer wavelength RF signals. For example, electrometer 100 may detect RF signals in the UHF through VHF range (e.g. at least 1 MHz through 1.5 GHz). It may be possible to detect RF signals at higher or lower frequencies. Rydberg detection may be possible from DC through the THz frequency ranges. For example, in some embodiments, the range of RF radiation detected may have frequencies of at least one hundred kHz through 40 GHz. Demodulation techniques have been demonstrated that support AM, FM, PM, along with 64+ QAM, showing data rates >1 Mbit/s for electrometer 100. Moreover, sensitivity is not inherently directional, which may prove useful in direction finding applications. Housing 160 may be RF transparent and enclose electrometer 100 for improved thermal stability. Housing 160 also provides mounting supports for fixturing within the cavity of container 166. Electrometer 100 may also have the desired sensitivity. In some embodiments, electrometer 100 may have a sensitivity a range of at least ten nanovolts per centimeter per square root Hertz (nV/cm/sqrt (Hz)) through not more than one hundred nV/cm/sqrt (Hz). For example, when the two Rydberg states are coupled a sensitivity of 10 nV/cm/sqrt (Hz) may be achieved at approximately one GHz. In another example, a sensitivity of 15 nV/cm/sqrt (Hz) at approximately 10 GHz may be achieved. Sensitivity may fall off at frequencies <1 GHz and >10 GHz. In general, a larger vapor chamber 120 corresponds to higher sensitivity. However, even for a vapor chamber on the order of one through ten cubic centimeters, sufficient sensitivity is achieved. Further, electrometer 100 may detect fields much larger than that (e.g. up to 70 dB higher field strengths). This indicates electrometer 100 has a large sensor dynamic range. Thus, electrometer 100 may have a high sensitivity, a wide bandwidth, a desired sensor dynamic range, and a compact size in a form factor that is sufficiently robust to be deployable.

Figure 3A:
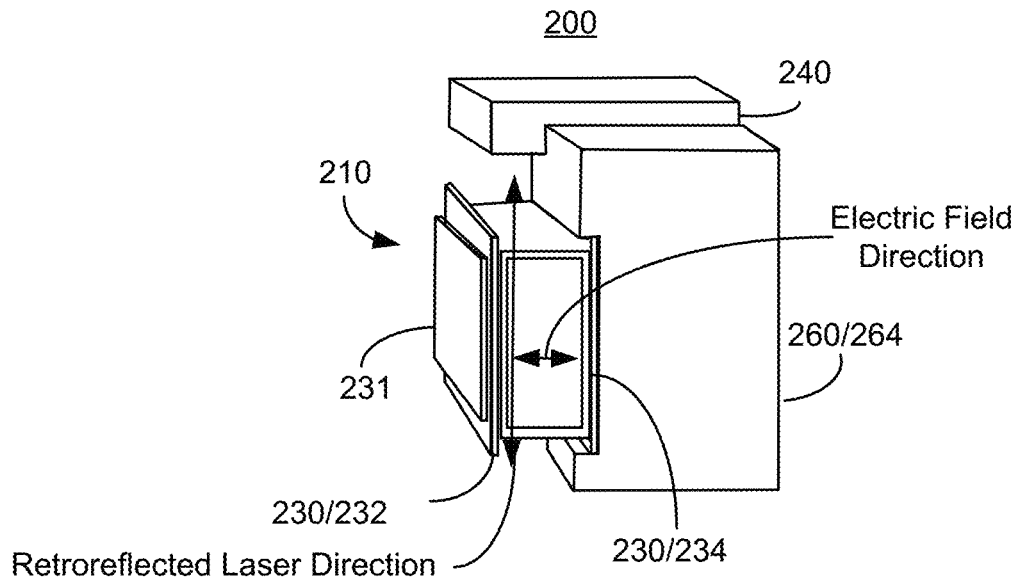
FIGS. 3A-3B depict an embodiment of an electrometer that is deployable.
Figure 3B:
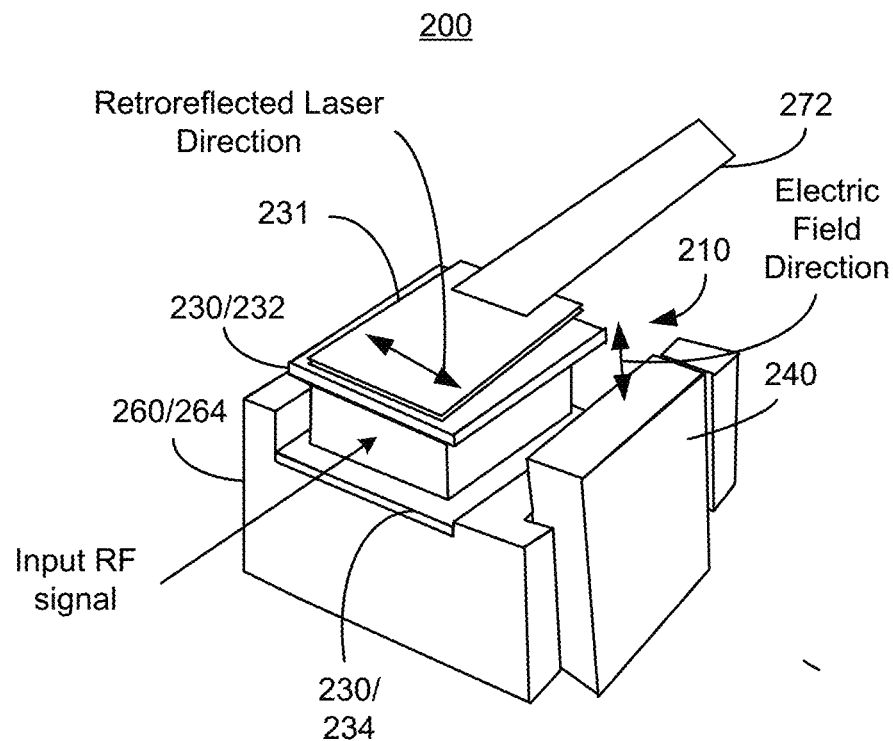

FIGS. 3A-3B are perspective views of an embodiment of electrometer 200 that is deployable and may be used as an RF detector. For clarity, FIGS. 3A-3B are not to scale and only portions of electrometer 200 are shown. Electrometer 200 includes vapor cell 210, electric field generator 230, micro-optical system 240, and housing 260. Other components of electrometer 200, such as a control electronic subsystem and/or a laser system, are not shown. Electrometer 200 is analogous to electrometer 100. Thus, vapor cell 210, electric field generator 230, micro-optical system 240, and housing 260 are analogous to vapor cell 110, electric field generator 130, micro-optical system 140, and housing 160, respectively. Also shown in FIGS. 3A-3B are the directions of the input RF signal, the general trajectory of the retroreflected laser beams, and the electric field.

Figure 4:
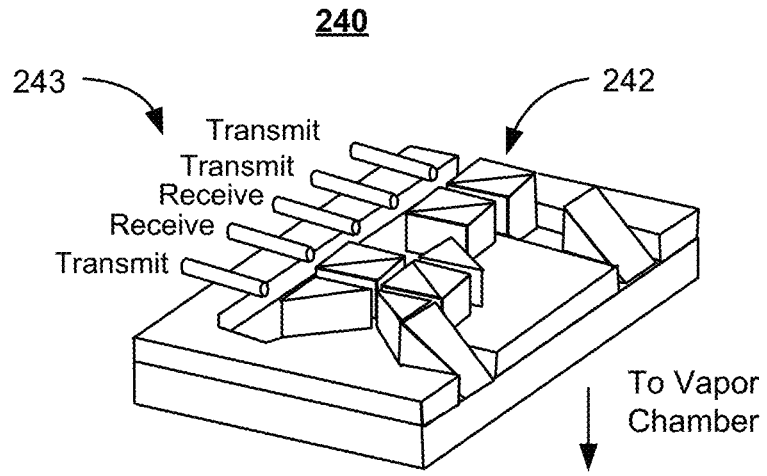
FIG. 4 depicts an embodiment of a micro-optical system usable in an electrometer that is deployable.

Vapor cell 210 is a glass vapor cell and includes a vapor of quantum particles (not visible). Electric field generator 230 includes silicon devices 232 and 234. Also shown is insulator 231 on silicon device 232. Silicon devices 232 and 234 provide an electric field in vapor cell 210. Micro-optical system 240 routes laser fields through vapor cell 210 in a direction transverse to the top and the bottom (e.g. transverse to the electric field). Housing 260 is a holder to which micro-optical system 240 and vapor cell 210 are mounted. Housing 260 may be a machinable ceramic, such as MACOR®. In the embodiment shown, vapor cell 210 has an internal volume on the order of one cubic centimeter. Larger volumes (e.g. up to and including ten cubic centimeters, fifty cubic centimeters, one hundred cubic centimeters, two hundred cubic centimeters, or more). Micro-optical system 240 guides multiple beams of laser light to and from vapor cell 210. FIG. 4 depicts an embodiment of micro-optical system 240. Micro-optical system 240 optical components 424 incorporating dichroic beam splitters, polarization optics, and turning mirrors to guide the laser radiation as desired to input/outputs 243.

Electrometer 200 operates in an analogous manner to and shares the benefits of electrometer 100. Electrometer 200 thus utilizes quantum particles for detection of RF signals. As a result, electrometer 200 may remain compact even for detection of longer wavelength RF signals. Vapor cell 210, micro-optical system 240, and electric field generator 230 have been miniaturized to provide detection of electrical signals (e.g. RF fields) using a very small volume. The alignment of these components may be achieved and maintained using holder 260/264. For example, components such as a retroreflector (not shown) for micro-optical system 240 may be mounted on a robotic arm and aligned with the input/outputs 243. Fine tuning may be achieved by monitoring the outputs of micro-optical system with a photodetector (not shown). When the output meets or exceeds specifications, the retroreflector may be affixed to holder 264 and released from the robotic arm. The corresponding control electronic subsystem (not shown), laser system (not shown), and other electronics, may be tethered to electrometer 200 while maintaining their functionality. Thus, electrometer 200 may be simpler to deploy and more robust. Holder 260 is configured to mitigate interference with the input RF signal. Consequently, electrometer 200 is a small, light, readily mountable package capable of detecting longer wavelength RF signals. Electrometer 200 may detect RF signals in the frequency ranges, have the data rates, and achieve the sensitivities discussed for electrometer 100. Thus, electrometer 200 may have a high sensitivity, a wide bandwidth, and a compact size in a form factor that is sufficiently robust to be deployable.

Figure 5:
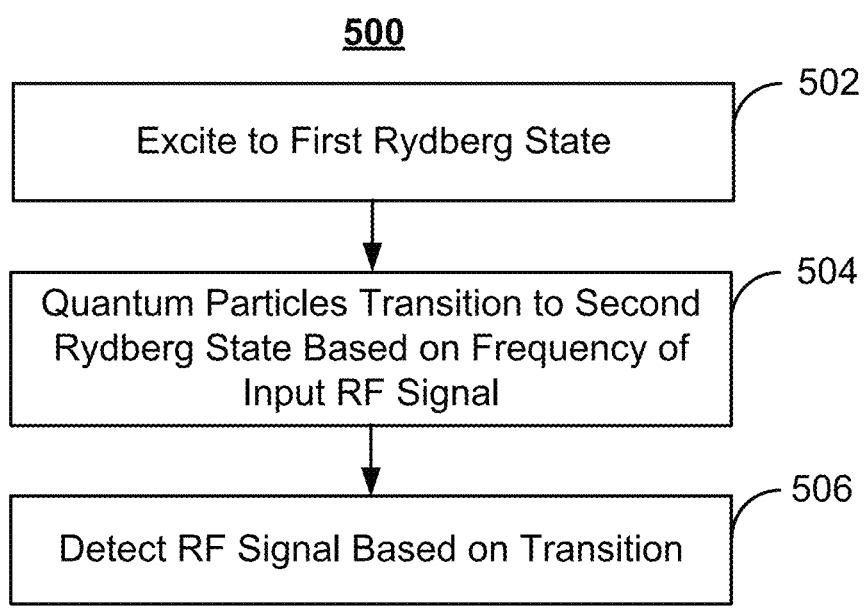
FIG. 5 is a flow-chart depicting an embodiment of a method for using an electrometer that is deployable.

FIG. 5 is a flow-chart depicting an embodiment of method 500 for using an electrometer that is deployable. Method 500 is described in the context of electrometer 100. However, method 500 may be used in conjunction with another electrometer, such as electrometer 200.

Quantum particles are excited to a first Rydberg state, at 502. In some embodiments, the Rydberg states of the quantum particles are tuned prior to excitation at 502. Tuning may be accomplished via a DC electric field that shifts the energy state. The tuning is utilized to provide the transitions between Rydberg states that correspond to the frequency of the RF signal desired to be detected. The quantum particles are exposed to the RF signal and transition to a second Rydberg state based on the frequency of the RF signal, at 504. Based on the populations of quantum state particles in the first and second Rydberg states, the RF signal may be detected, at 506.

Figure 6:
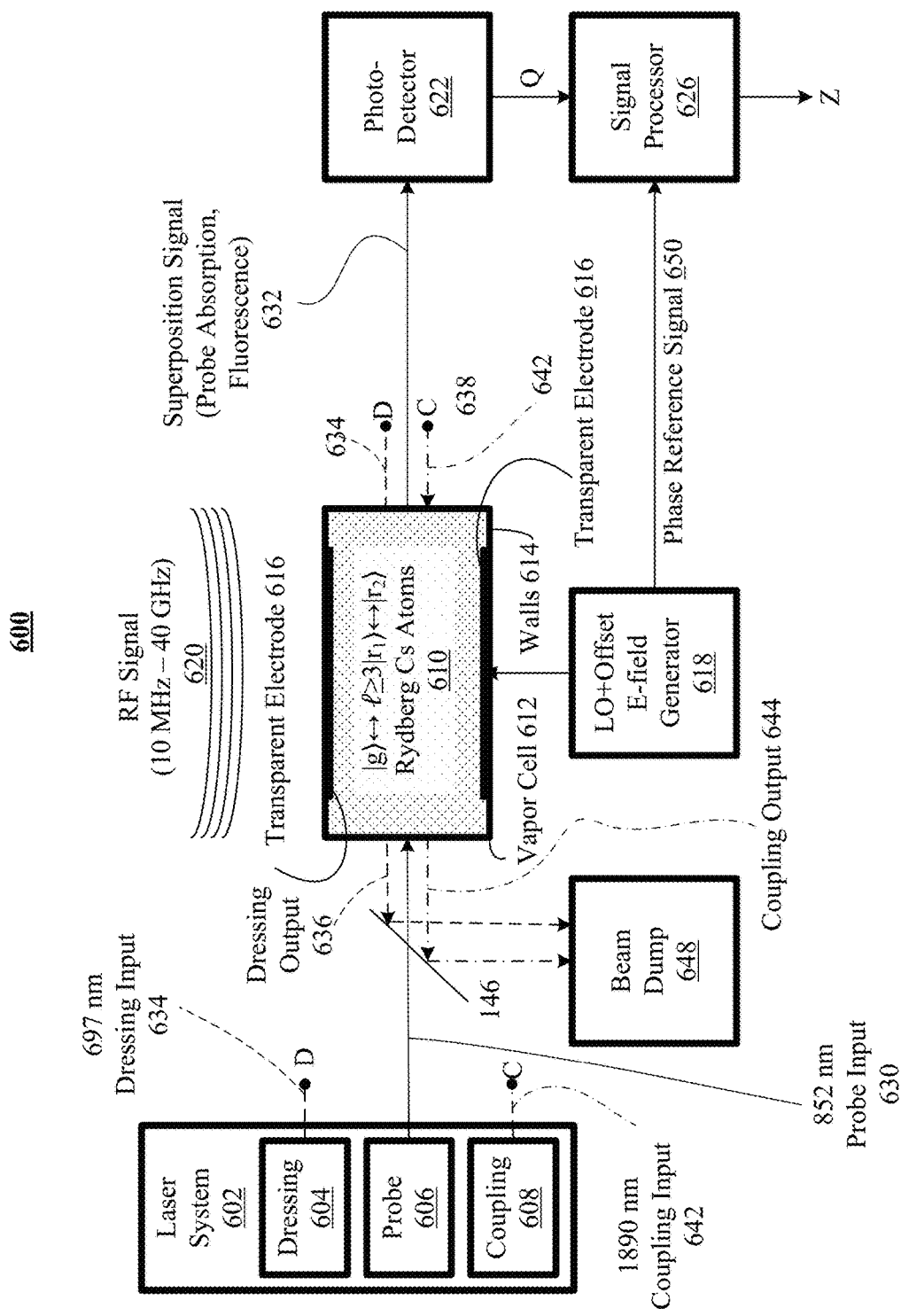
FIG. 6 depicts an embodiment of an RF detector that is deployable.
Figure 7:
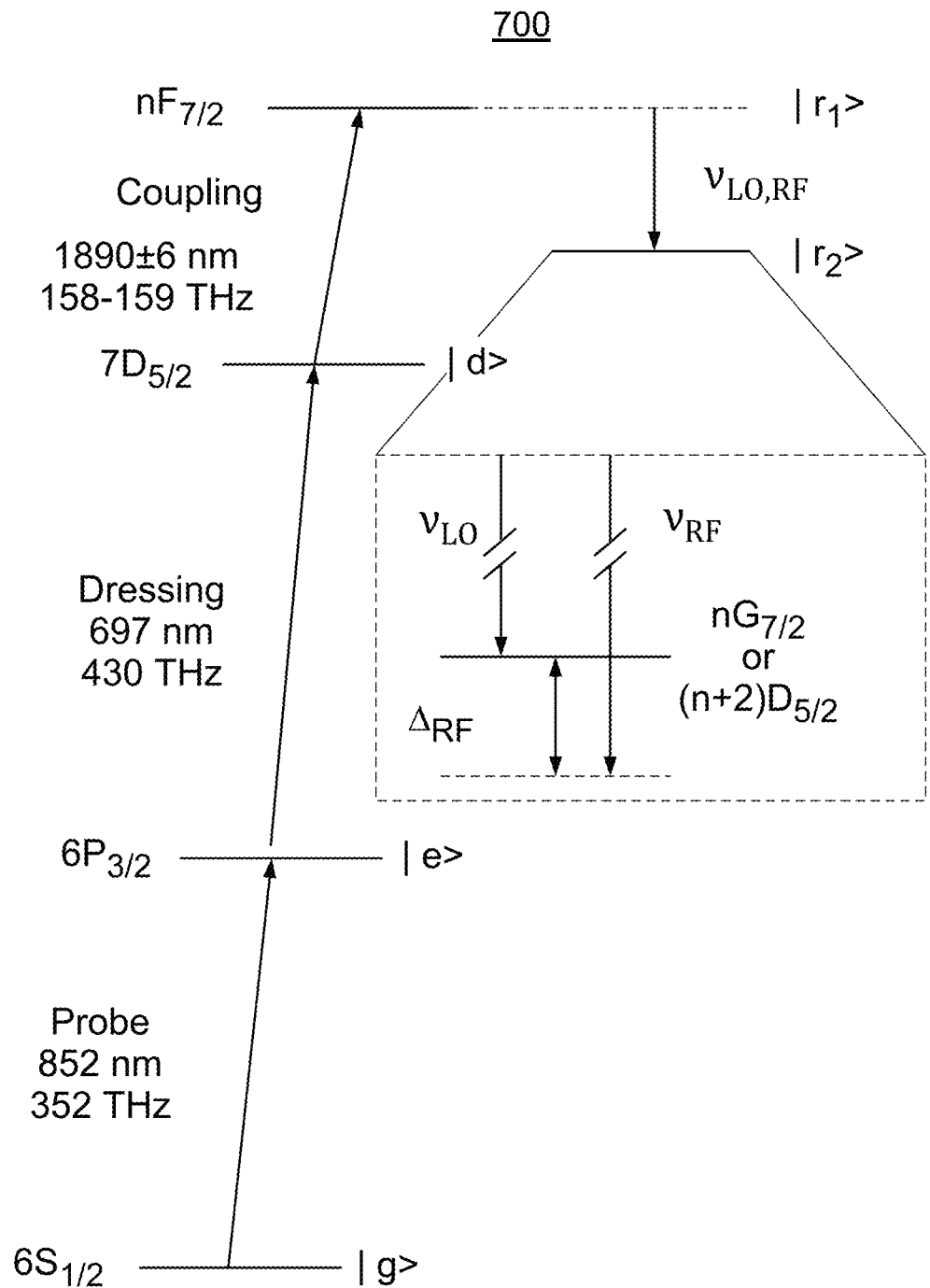
FIG. 7 depicts an embodiment of transitions for quantum particles usable in an RF detector that is deployable.
Figure 8:
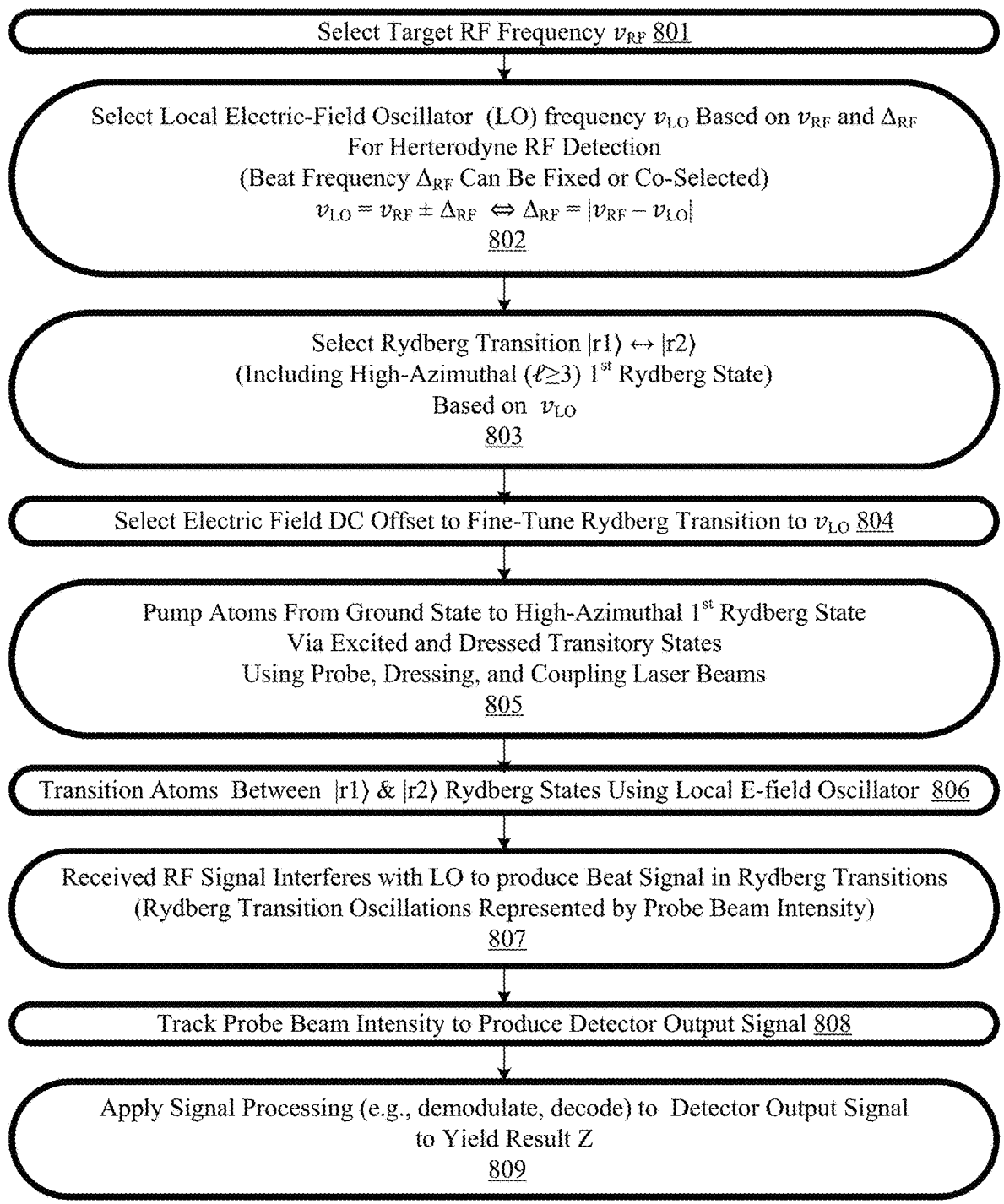
FIG. 8 depicts an embodiment of a method for detecting an RF signal using quantum particles in an RF detector that is deployable.

In some embodiments, a heterodyne detection scheme may be used. For example, FIGS. 6-8 depict embodiments of techniques that use a heterodyne detection scheme for a deployable sensor. The systems and methods may be used in connection with deployable electrometers, such as electrometers 100 and/or 200. System 600 and method 800 utilize high-azimuthal Rydberg states. In other embodiments, other Rydberg states might be utilized.

The lasers required to pump atoms to a high-azimuthal Rydberg state can include not only a probe beam and a coupling beam, but also one or more dressing beams. For a transition between a ground state and a Rydberg state, the inclusion of a dressing beam decreases the maximum frequency and energy of laser beams required to effect the transition. Moreover, two laser beams (e.g., dressing and coupling) can be counter-propagated against a third (e.g., probe) beam to offset Doppler effects that would otherwise result in wider linewidths and lower sensitivity. Accordingly, there are several advantages of an RF receiver that uses high-azimuthal Rydberg states over a receiver than is limited to laser pumping to low azimuthal Rydberg states.

An electron in an atom can be characterized using four quantum numbers: a principal quantum number (n), an azimuthal quantum number (l) that corresponds to angular momentum, a magnetic quantum number ($m_l$), and a spin quantum number ($m_s$). Herein, Rydberg states are states with high principal numbers n, including principle numbers in the range 30≤n≤70 of interest herein. Herein, in the case of a high-azimuthal state, the azimuthal quantum number l is an integer greater than or equal to three; stated otherwise l≥3. On the other hand, l=0, l=1, and l=2, represent low azimuthal states. In some contexts, azimuthal quantum numbers are expressed as letters, for example, S, P, D, F, G, H, I, K, L, and M correspond respectively to the following numerical values of l: 0, 1, 2, 3, 4, 5, 6, 7, 8, and 9. Thus, S, P, D represent low-azimuthal states, while F, G, H, I, K, L and M represent high azimuthal states (aka, high angular momentum states).

For example, a high-azimuthal Rydberg state RF receiver 600 includes a laser system 602 with a dressing laser 604, a probe laser 606, and a coupling laser 608, as shown in FIG. 6. These lasers are used to transition cesium 133 ($^{133}$Cs) atoms 610 in a vapor cell 612 from a ground state to a first Rydberg state. As indicated for the scenario represented in FIG. 7, the probe laser outputs an 852 nanometers (nm) probe beam that transitions Cs atoms from a $6S_{1/2}$ ground-state |g⟩ to an $6P_{3/2}$ excited state |e⟩. The dressing laser outputs a 697 nm dressing beam that transitions atoms in the $6P_{3/2}$ excited state |e⟩ to a $7D_{5/2}$ dressed state |d⟩. The coupling laser transmits an 1890 nm coupling beam that transitions from the dressed state to a first Rydberg state |$r_1$⟩ belonging to a class of $nF_{7/2}$ high-azimuthal Rydberg states, where n is a principle number of a Rydberg state and 30≤n≤70. The value of principle number n is selected based on the selected target RF frequency to be detected. The exact wavelength of the coupling beam can vary as a function of principle number n, but for 30≤n≤70, the coupling wavelength within 1890±6 nm. When the probe, dressing, and coupling beams are all active, the atoms end up in a superposition of the ground and first Rydberg states.

Probe laser 606 outputs a probe beam that is represented in FIG. 6 by a probe input beam segment 630 that is input to vapor cell 612 from the left, and a probe output beam segment 632 that exits vacuum cell 612 on its way to photodetector 622. Dressing laser 604 outputs a dressing beam represented by a dressing beam input segment 634 that is input to vapor cell 622 (via node D) from the right and a dressing beam output segment 636 that is output from vapor cell 612 and reflected by dichroic mirror 646 to beam dump 648. Coupling laser 608 outputs a coupling beam that is represented by a coupling input segment 642 that is input (via node C) to vapor cell 612 from the right and coupling output segment 644 that exits vapor cell 622 and is redirected by dichroic mirror 646 to be dumped at beam dump 648.

Not all laser beams input segments enter vapor cell 612 from the same end. Instead, the beams enter from opposite ends to offset set some of the Doppler shifts caused by the beams. If the dressing beam were omitted, a higher frequency, shorter wavelength probe beam would be required; even if the probe and coupling beams were counter-propagated, the difference frequency would be large resulting in more band broadening and greater noise due to Doppler shifts. Also, if only probe and coupling beams were used, one would not have access to the F-G transitions, so the inclusion of the dressing beam increases the variety of Rydberg states available to match target RF frequencies.

Vapor cell 612 (FIG. 6) includes six glass walls 614 contact bonded to define a rectangular parallelepiped vacuum boundary. The glass material is selected to be transparent to the laser and RF frequencies of interest. Transparent electrodes 616, e.g., of indium titanium oxide (ITO) are formed on the interior surfaces of opposing walls 614. An electric-field generator 618 is electrically coupled to electrodes 616 to control the electric field within vapor cell 612.

Generator 618 outputs an e-field drive signal that has both constant (DC) and time-varying (AC) components. The DC component is used for fine tuning based on the DC Stark effect. The AC component is used to down-convert an incident RF signal to beat frequency that can be demodulated and decoded by a signal processor.

The time-varying component is provided by a local oscillator (LO) that is adjusted so that its frequency $v_{LO}$ differs from the frequency $v_{RF}$ of the target RF signal 620 by a predetermined difference or "beat" frequency $\Delta_{RF}$, as indicated in FIG. 7. The constant component of the e-field control signal is adjusted to fine tune the Rydberg transition between the first Rydberg state $|r_1\rangle$ and a second Rydberg state $|r_2\rangle$ so that the resonance frequency for the transition matches the local oscillator frequency. In the absence of an incident RF signal at the target RF frequency $v_{RF}$, the internal electric field oscillating at the local oscillator frequency $v_{LO}$ induces transitions between Rydberg states $|r_1\rangle$ and $|r_2\rangle$, modifying the superposition of the ground state and the first Rydberg state to a 3-way superposition among the ground state $|g\rangle$, the first Rydberg state $|r_1\rangle$, and the second Rydberg state $|r_2\rangle$. The effect on the superposition shows up as a change in the probe beam output intensity.

An incident RF signal at the target frequency $v_{RF}$ interferes with the e-field oscillations causing the distribution of atoms between the $|r_1\rangle$ and $|r_2\rangle$ Rydberg states to oscillate at the beat frequency $\Delta_{RF}$. This oscillation in the distribution of atoms is represented in the probe output signal as an oscillation of the probe beam output intensity at the beat frequency $\Delta_{RF}$ and, thus, in the photodetector output signal Q. The photodetector output signal Q can then be demodulated and otherwise processed by signal processor 626 to yield an output corresponding to the content of incident RF signal 620.

Under the influence of the electric field at the local oscillator frequency $v_{LO}$, the distribution of atoms among the ground state $|g\rangle$ the $|r_1\rangle$ AND $|r_2\rangle$ Rydberg states oscillates at the beat frequency $\Delta_{RF}$ and thus, the intensity of probe output 632 varies that the local oscillator frequency $v_{LO}$. Upon reception, RF signal 620 alternatively interferes constructively and destructively with the e-field oscillations to produce a difference frequency equal to the pre-selected difference frequency $\Delta_{RF}$. This beat frequency $\Delta_{RF}$ is imposed on the intensity of probe-beam output segment 632 as detected by photodetector 622. The photodetector output varies at the beat frequency and can be demodulated and decoded to yield an output z suitable for the intended application. E-field generator 618 outputs a phase reference signal 650 to signal processor 626 to allow it to phase lock to the incoming filtered signal.

In an alternative embodiment, fluorescence resulting from decay of atoms for the first Rydberg state to the ground state is detected in lieu of or in addition to probe absorption. To generalize, signal 632 is termed a "superposition signal" as it tracks the percentage of quantum particles in the ground state at any given time. In the absence of an incident RF signal at the target RF frequency, this percentage is constant; in the presence of the RF signal at the target RF frequency, the superposition signal oscillates at the beat frequency due to mixing of the RF signal and the E-field oscillations.

A high-azimuthal Rydberg RF receiver process 800, flow-charted in FIG. 8, includes selecting a target RF frequency $v_{RF}$ at 801. This target frequency can be selected, for example, from a wideband range of 10 megahertz (MHz) to 40 gigahertz (GHz). Process 800 can be iterated, and different target RF frequencies can be selected for different iterations.

A local oscillator frequency $v_{LO}$ is determined, at 802, based on the target RF frequency $v_{RF}$. More specifically, $v_{LO} = v_{RF} \pm \Delta_{RF}$, where $\Delta_{RF}$ is a beat frequency, e.g., in the 10-20 MHz range, selected for use in a heterodyne detection scheme. In some embodiments, beat frequency $\Delta_{RF}$ is fixed and independent of the target RF frequency $v_{RF}$ and of the local oscillator frequency $v_{LO}$, while in others, the beat frequency $\Delta_{RF}$ is selected along with the local oscillator frequency $v_{LO}$ based on the target RF frequency $v_{RF}$.

A Rydberg transition is selected at 803 with resonance at or near the selected local oscillator frequency $v_{LO}$. This requires specifying a first Rydberg state with a high (l≥3) azimuthal quantum number. For example, in FIG. 8, the F Rydberg state $|r_1\rangle = nF_{7/2}$ corresponds to an azimuthal quantum number l=3. In addition, a second Rydberg state $|r_2\rangle$ is selected, which can but need not have a high azimuthal quantum number. The example of FIG. 8 presents alternative second Rydberg states, one (nG7/2) which has a high azimuthal quantum number l=4, and one (n+2) $D_{5/2}$ that has a low azimuthal quantum number l=2.

The selection of Rydberg states can be constrained by the laser wavelengths available to pump ground state quantum particles to the first Rydberg state $|r_1\rangle$. One practical example of laser wavelengths is presented in FIG. 7: The probe, dressing, and coupling wavelengths are 852 nm, 697 nm, and 1890 nm, with the coupling wavelength being tunable ±6 nm. An alternative system uses 852 nm, 921 nm, and 1140±3 nm respectively for the probe, dressing and coupling beams.

A DC (constant voltage) offset is selected at 804. The DC offset can be zero volts in the event that the local oscillator frequency $v_{LO}$ is resonant with the selected Rydberg transition. Otherwise, a DC offset is used to apply a DC Stark shift to fine tune the Rydberg transition resonance to the local oscillator frequency $v_{LO}$. If the available Rydberg transition resonances are widely spaced, DC offsets in excess of 12 volts can be required, but risk being ineffectual due to the Inglis-Teller limit. By providing for high azimuthal Rydberg states, the present invention provides a greater selection of Rydberg transitions, which allows their resonances to be more closely spaced so lower maximum DC offset voltages are required, reducing risk due to the Inglis-Teller limit.

Quantum particles, e.g., cesium 133 or rubidium 87 atoms, are pumped, at 805, from a ground state |g⟩ to the first Rydberg stat |r₁⟩ via transitions through an excited and dressing transitory states |e⟩ and |d⟩. As a result, the quantum particles are in a superposition of the ground state |g⟩ and the first Rydberg state |r₁⟩. As quantum particles are pumped to the first Rydberg state |r₁⟩, others return from the first Rydberg state |r₁⟩ to the ground state |r₁⟩ through stimulated or spontaneous decay. This ensures a constant superposition percentage is available for pumping; this percentage is represented by the amount of the probe beam absorbed as ground state quantum particles absorb probe photons. Thus, the distribution of quantum particles between the ground state |g) and the first Rydberg state can be tracked by monitoring the probe output from the cell containing he quantum particles. Alternatively, fluorescence due to decay can be indicate the percentage of superposition associated with the ground state |g⟩.

One an offset oscillating electric field is activated, at 806, in the cell at the local oscillator frequency $v_{LO}$, quantum particles can transition back and forth between the first Rydberg state |r₁⟩ and the second Rydberg state |r₂⟩. This access to the second Rydberg state competes with the return path from the first Rydberg state to the ground state. In the absence of an incident RF wavefront at frequency $v_{LO}$, this reduction results in lower probe beam absorption and/or lower fluorescence. At this point the quantum particles are in a three-way superposition among the ground state |g⟩, first Rydberg state |r₁⟩, and second Rydberg state |r₂⟩.

An RF wavefront at the target RF frequency received at 807 interferes with the electric field oscillations at the local oscillator frequency $v_{LO}$, to provide oscillations of constructive and destructive at the beat frequency $\Delta_{RF}$. During half cycles of constructive interference, the coupling of the first Rydberg state |r₁⟩ to the second Rydberg state |r₂⟩ is maximal, resulting in a lowered probe beam absorption and/or fluorescence intensity. During half cycles of destructive interference, coupling between the Rydberg states is minimal and probe beam absorption and/or fluorescence intensity are maximal.

The oscillations at the beat frequency $\Delta_{RF}$ can be tracked, at 808, by a photodetector, resulting in a photodetector output that oscillates at the beat frequency. A signal processor can process (e.g., demodulate and decode) the photodetector (e.g., to access data carried by the incident RF wavefront) at 809 to yield a result Z.

Operational platforms require freedom of action in contested environments, including freedom to maneuver across the electromagnetic spectrum. Capabilities based on electromagnetic principles, like communications and radar depend on antennas as a key component to transmit and receive RF waves. Furthermore, the spectral properties of antennas depend on their size, coupling platform integration form factors with feasible applications, limiting their potential.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An electrometer, comprising:
   a housing;
   a vapor cell having a top and a bottom and including a vapor of quantum particles;
   a micro-optical system configured to route laser fields through the vapor cell in a direction transverse to the top and the bottom;
   an electric field generator configured to provide an electric field in the vapor cell; and
   a control electronic subsystem;
   wherein the housing includes a surface adapted to mate to a portion of a fuselage surrounding a hole.

2. The electrometer of claim 1, wherein the laser fields excite the quantum particles to a first Rydberg state, the quantum particles transitioning to a second Rydberg state in response to an incident radio frequency (RF) signal having a RF frequency of $v_{RF}$.

3. The electrometer of claim 2, wherein the laser fields include a probe beam transmitted through the vapor cell;
   wherein the electric field generator provides the electric field within the vapor cell such that a distribution between the first Rydberg state and the second Rydberg state and an intensity of the probe beam vary at a local oscillator frequency $v_{LO}$, and such that the incident RF signal having the RF frequency of $v_{RF}$ interferes to yield a beat frequency $\Delta_{RF}$ that is imposed on the distribution between the first Rydberg state and the second Rydberg state and on the intensity of the probe beam; the electrometer further comprising
   a photodetector for producing a photodetector signal that tracks the intensity of the probe beam; and
   a signal processor for decoding the photodetector signal.

4. The electrometer of claim 3, wherein the micro-optical system further provides a coupling laser beam and at least one dressing laser beam, the probe beam, the at least one dressing beam and the coupling laser beam cooperating to pump the quantum particles to the first Rydberg state.

5. The electrometer of claim 2, wherein the incident RF signal having the RF frequency of $v_{RF}$ has a range of at least one MHz through not more than 1.5 GHz.

6. The electrometer of claim 2, wherein a sensitivity of the electrometer includes a range of at least ten nanovolts per centimeter per sqrt (Hz) through not more than one hundred nanovolts per centimeter per sqrt (Hz).

7. The electrometer of claim 2, wherein the housing includes a flange having the surface and a dielectric holder for the vapor cell, the dielectric holder configured to mitigate interference with the incident RF signal.

8. The electrometer of claim 1, wherein the vapor cell is fluidically coupled to a source cell including a plurality of alkali atoms for the quantum particles.

9. The electrometer of claim 1, wherein the vapor cell has a volume of less than one hundred cubic centimeters.

10. The electrometer of claim 9, wherein the volume is less than fifty cubic centimeters.

11. The electrometer of claim 1, wherein the electric field generator includes a semiconductor device coupled to the top of the vapor cell and wherein the control electronic subsystem includes a voltage source coupled with the semiconductor device by a tether.

12. The electrometer of claim 11, wherein the top of the vapor cell includes a glass wall, and wherein the semiconductor device is anodically bonded to the glass wall.

13. The electrometer of claim 11, wherein the voltage source provides at least one of a DC voltage and a time varying voltage to the semiconductor device.

14. The electrometer of claim 1, wherein the micro-optical system includes a first portion and a second portion, the first portion being coupled with a first wall of the vapor cell and optically coupled with at least one laser of a laser system, the second portion including a retroreflector coupled with a second wall of the vapor cell, the first wall being opposite to the second wall such that a laser beam from the first portion of the micro-optical system traverses the vapor cell, is reflected by the retroreflector, and returns to the micro-optical system.

15. A radio frequency (RF) radiation detector, comprising:
a housing including a surface and a container, the surface being adapted to mate to a portion of a fuselage surrounding a hole; and
an electrometer coupled with the housing and including a vapor cell having a top and a bottom, a micro-optical system, an electric field generator, a laser system for providing laser fields, and a control electronic subsystem, the vapor cell including a vapor of quantum particles and residing in the container of the housing, the micro-optical system residing in the container and configured to route the laser fields through the vapor cell in a direction transverse to the top and the bottom, at least a portion of the electric field generator being in the container;
wherein the laser fields excite the quantum particles to a first Rydberg state, the quantum particles transitioning to a second Rydberg state in response to an incident RF signal having a RF frequency of $v_{RF}$.

16. The RF radiation detector of claim 15, wherein the RF frequency of $v_{RF}$ has a range of at least one MHz through not more than 1.5 GHz.

17. The RF radiation detector of claim 15, wherein a sensitivity of the RF detector includes a range of at least ten nanovolts per centimeter per sqrt (Hz) through not more than one hundred nanovolts per centimeter per sqrt (Hz).

18. The RF radiation detector of claim 15, wherein the top of the vapor cell includes a glass wall, wherein the electric field generator includes a semiconductor device anodically bonded to the glass wall of the vapor cell, and wherein the control electronic subsystem includes a voltage source coupled with the semiconductor device by a tether.

19. A method, comprising:
exciting, by laser fields, quantum particles in a vapor cell of an electrometer to a first Rydberg state, the electrometer being coupled to a housing and including the vapor cell, a micro-optical system, an electric field generator, and a control electronic subsystem, the housing including a surface and a container, the surface being adapted to mate to a portion of a fuselage surrounding a hole, the vapor cell including a vapor of the quantum particles and residing in the container of the housing, the vapor cell having a top and a bottom, the micro-optical system residing in the container and configured to route the laser fields through the vapor cell in a direction transverse to the top and the bottom, at least a portion of the electric field generator being in the container,
receiving an incident radio frequency (RF) signal in the vapor cell;
wherein the quantum particles transition to a second Rydberg state in response to the incident RF signal having an RF frequency of $v_{RF}$.

20. The method of claim 19, wherein the laser fields include a probe beam, the method further comprising:
generating, by the electric field generator, an oscillating electric field having a local oscillator frequency $v_{LO}=v_{RF}\pm\Delta_{RF}$, wherein $\Delta_{RF}$ is a beat frequency resulting from mixing a target radio frequency with the local oscillator frequency, a distribution of the quantum particles between the first Rydberg state and the second Rydberg state and an intensity of the probe beam oscillating at the local oscillator frequency $v_{LO}$.

* * * * *